US011350718B2

(12) United States Patent
Lecocke et al.

(10) Patent No.: US 11,350,718 B2
(45) Date of Patent: Jun. 7, 2022

(54) GO-BAG FOR EMERGENCY SITUATIONS

(71) Applicant: UIPCO, LLC, San Antonio, TX (US)

(72) Inventors: Meredith Beveridge Lecocke, San Antonio, TX (US); Michael J. Maciolek, Boerne, TX (US); Robert Wiseman Simpson, Fair Oaks Ranch, TX (US); Daniel Christopher Bitsis, Jr., San Antonio, TX (US); Bobby Lawrence Mohs, San Antonio, TX (US); Manfred Amann, San Antonio, TX (US); Emily Margaret Gray, San Antonio, TX (US); Donnette Moncrief Brown, San Antonio, TX (US)

(73) Assignee: United Services Automobile Association (USAA), San Antonio, TX (US)

(*) Notice: Subject to any disclaimer, the term of this patent is extended or adjusted under 35 U.S.C. 154(b) by 202 days.

(21) Appl. No.: 16/456,136

(22) Filed: Jun. 28, 2019

(65) Prior Publication Data
US 2020/0205539 A1 Jul. 2, 2020

Related U.S. Application Data

(60) Provisional application No. 62/786,929, filed on Dec. 31, 2018.

(51) Int. Cl.
A45C 15/00 (2006.01)
A45F 3/04 (2006.01)
A45C 13/00 (2006.01)
A45C 3/00 (2006.01)
H02S 99/00 (2014.01)
A45F 3/00 (2006.01)

(52) U.S. Cl.
CPC ............... A45C 15/00 (2013.01); A45C 3/00 (2013.01); A45C 13/008 (2013.01); A45F 3/04 (2013.01); A45F 2003/003 (2013.01); H02S 99/00 (2013.01)

(58) Field of Classification Search
CPC ......... A45C 15/00; A45C 13/008; A45C 3/00; A45C 1/00; H02S 99/00; A45F 2003/003; A45F 3/04; Y02E 10/50; H01L 31/042
USPC .................................................. 206/216, 223
See application file for complete search history.

(56) References Cited

U.S. PATENT DOCUMENTS 3,292,748 A 12/1966 Rifkin
4,157,134 A * 6/1979 Stoll ........................ A45C 9/00
190/1
4,790,463 A * 12/1988 Hansen ..................... A45F 3/04
114/315

(Continued)

OTHER PUBLICATIONS

Invitation to Pay Additional Fees dated Feb. 19, 2020 for Application No. PCT/US2019/066700.

(Continued)

Primary Examiner — J. Gregory Pickett
Assistant Examiner — Jenine Pagan
(74) Attorney, Agent, or Firm — Plumsea Law Group, LLC

(57) ABSTRACT

A go-bag is disclosed. The bag is designed to contain valuables and important documents, and protect these contents during an emergency evacuation situation. The bag can waterproof and float in water. The bag can also be made of a flame resistant material. The bag can include a self-orienting feature where the bag can float in water and automatically rotate to achieve the proper orientation so that the integrated solar panel is facing upwards towards the sun.

16 Claims, 13 Drawing Sheets

(56) References Cited

U.S. PATENT DOCUMENTS

| | | | |
|---|---|---|---|
| 4,966,279 A * | 10/1990 | Pearcy | A45C 3/00 190/100 |
| 6,030,147 A | 2/2000 | Bowden | |
| 6,066,017 A | 5/2000 | Max et al. | |
| 8,393,450 B2 | 3/2013 | Lynch-Ringvold | |
| 8,561,212 B2 | 10/2013 | Saotome | |
| 9,533,744 B2 * | 1/2017 | Leatherman | A45C 9/00 |
| 9,545,146 B1 * | 1/2017 | King | H04N 1/00103 |
| 10,758,018 B1 * | 9/2020 | Dawkins | B32B 25/045 |
| 2008/0040837 A1 | 2/2008 | King et al. | |
| 2009/0279810 A1 * | 11/2009 | Nobles | A45C 13/00 383/66 |
| 2014/0061273 A1 | 3/2014 | Bullivant et al. | |
| 2015/0228174 A1 * | 8/2015 | Bauer | A45F 4/02 340/539.13 |
| 2016/0084454 A1 * | 3/2016 | Svitak, Sr | G08B 25/00 362/183 |
| 2017/0188679 A1 * | 7/2017 | Jacob | A45C 5/03 |
| 2018/0020791 A1 * | 1/2018 | Cole | A45F 3/005 224/576 |

OTHER PUBLICATIONS

International Search Report and Written Opinion dated Apr. 28, 2020 for Application No. PCT/US2019/066700.

Omer Floating Dry Bag (Planet Multi Store) Apr. 2, 2017 (Apr. 2, 2017) [online] <URL: https://www.youtube.com/watch?v=GMX4wyN-EUI> 0:20-0:30.

International Preliminary Report on Patentability dated Jul. 15, 2021 for International Patent Application No. PCT/US2019/066700.

* cited by examiner

GO-BAG FOR EMERGENCY SITUATIONS

CROSS-REFERENCE TO RELATED APPLICATIONS

This application claims the benefit of Provisional Patent Application No. 62/786,929 filed Dec. 31, 2018, and titled "Go-Bag for Emergency Situations," which is incorporated by reference herein in its entirety.

TECHNICAL FIELD

The present disclosure generally relates to containers, and in particular, to bags that can protect their contents during emergency situations.

BACKGROUND

Severe weather, natural disasters, fires and other extreme conditions can force the evacuation of large numbers of people. Often, people are unprepared for evacuation, and in the urgent rush to evacuate with family members and pets, important objects and documents can be left behind and eventually destroyed. There is a need in the art for a container that can protect valuables and important documents during an emergency situation.

SUMMARY

In one aspect, a go-bag includes two side walls and an outer perimeter. One of the edges of the outer perimeter has a releasable closing system, while the remaining edges are permanently attached, creating an interior void that can be filled with valuables and documents. One of the side walls includes a solar panel disposed on an outer surface. That side wall also includes a first buoyant portion that is larger than the buoyant portion of the other side wall. This buoyancy imbalance causes the solar panel side of the bag to be more buoyant than the other side. This arrangement helps the bag to float, and to automatically rotate the bag in water so that the solar panel faces upwards towards the sun. Preferably, the bag is waterproof and flame resistant.

In another aspect, the bag includes a battery storage compartment disposed on the opposite side of the bag as the solar panel. In some versions, the bag can include an embedded electrical conductor that extends from the solar panel to the battery compartment.

In another aspect, the bag includes an integrated handle and optional identification marks.

Other systems, methods, features, and advantages of the disclosure will be, or will become, apparent to one of ordinary skill in the art upon examination of the following figures and detailed description. It is intended that all such additional systems, methods, features, and advantages be included within this description and this summary, be within the scope of the disclosure, and be protected by the following claims.

BRIEF DESCRIPTION OF THE DRAWINGS

The disclosure can be better understood with reference to the following drawings and description. The components in the figures are not necessarily to scale, emphasis instead being placed upon illustrating the principles of the invention. Moreover, in the figures, like reference numerals designate corresponding parts throughout the different views.

DESCRIPTION OF EMBODIMENTS

Embodiments provide a container that can store and protect valuables and important documents during an emergency situation. Emergency situations can refer to situations that are caused by natural disasters such as hurricanes or wildfires. Various embodiments of the bag may allow a user to safely transport items. In some instances, an emergency situation may cause an unsafe environment such as flooding or fires. The embodiment of the system may allow the transported items to remain protected from water and/or fire. Other emergency situations may leave a user with no electrical power or access to electronic necessities. In some embodiments, the system may provide electrical power to electronic devices. In some situations where flooding may occur, some embodiments of the system may provide a waterproof vessel for items to remain dry and float. In other embodiments, the vessel may float in a predetermined orientation so that the bag can continue to generate electrical power for a user. In some embodiments, the system may include identification features so that the bag can be returned to its owners.

Figure 1:
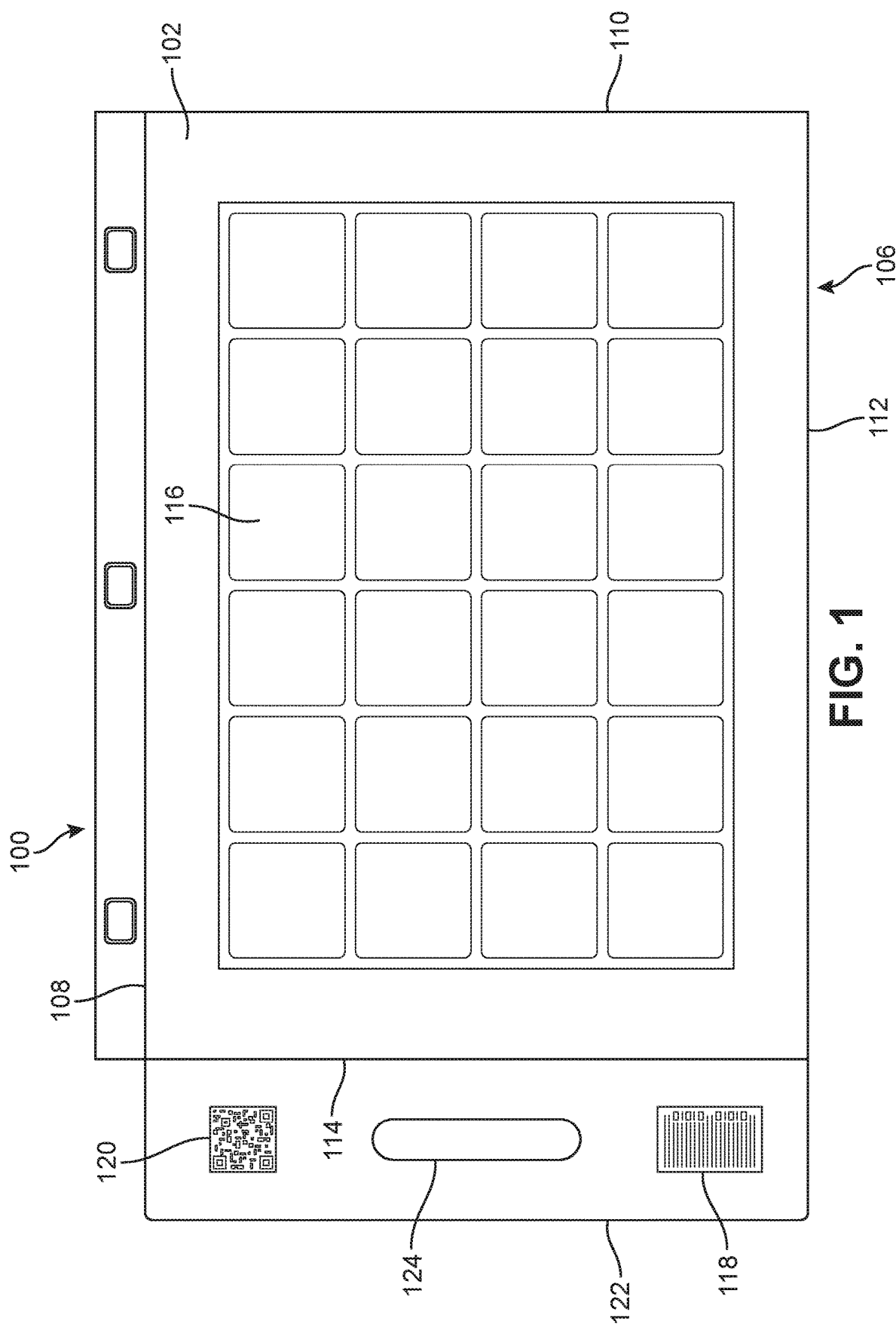
FIG. 1 is a schematic diagram of an embodiment of a bag.
Figure 2:
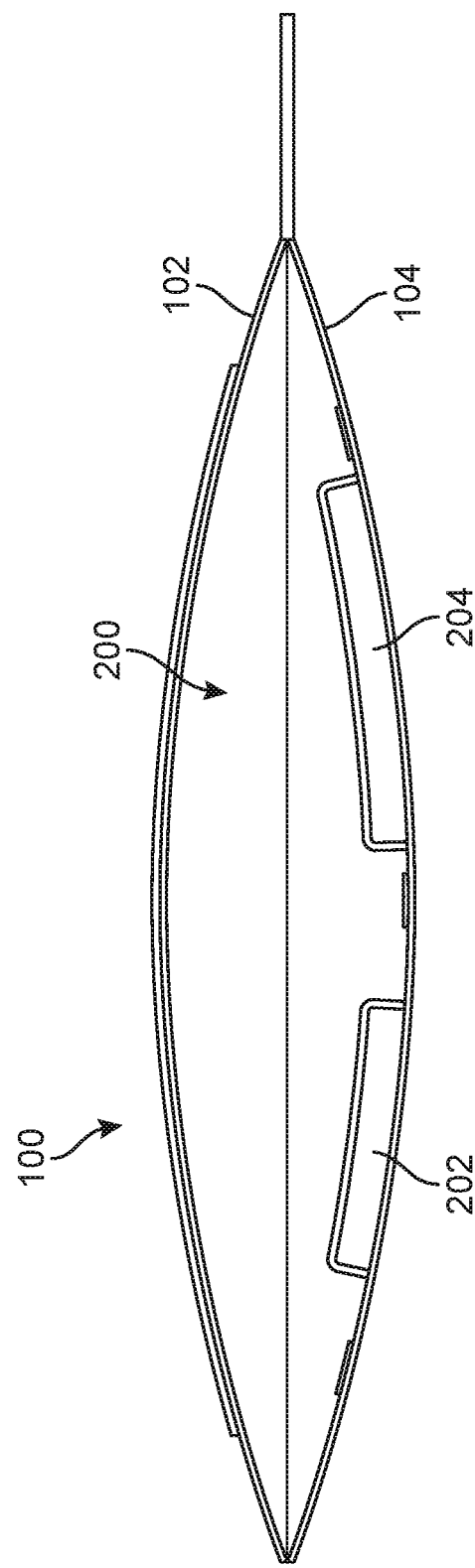
FIG. 2 is a schematic diagram of an embodiment of an open bag, viewing into its interior space.

FIG. 1 is a schematic diagram of an embodiment of a bag 100. Bag 100 may be configured to be any shape or size. Referring to FIG. 1, bag 100 shown in that Figure is generally rectangular. However, it should be kept in mind that the principles of the invention can apply to a bag having any shape or size. Bag 100 can include a perimeter with one or more edges. In the embodiment shown in FIG. 1, bag 100 may include two side walls that include a perimeter 106. The term "side wall" is used to generally describe the sides of the bag. It is not intended to imply that the sides of the bag are necessarily rigid. In contrast, embodiments of the bag are preferably constructed of generally flexible side walls. First side wall 102 is shown in FIG. 1, and opposite second side wall 104 can be seen in FIG. 2. As shown in FIG. 2, first side wall 102 is opposite second side wall 104. First side wall 102 is preferably joined to second side wall 104 to form an interior pocket or void.

In some embodiments, the two side walls may be permanently joined on multiple edges. In this specification and claims, "permanently joined" means that the walls can only be separated by destructive separation of one or both walls, or the joint must be damaged or destroyed to separate the first wall from the second wall at that location. The two side walls of bag 100 may be permanently joined on three edges of the perimeter 106, including a second edge 110, a third edge 112, and a fourth edge 114. The remaining fourth edge, a first edge 108, may be selectively joined by a seal. In some embodiments, the arrangement of the edges of perimeter 106 can create an interior void 200 of bag 100 (see FIG. 2).

Figure 4:
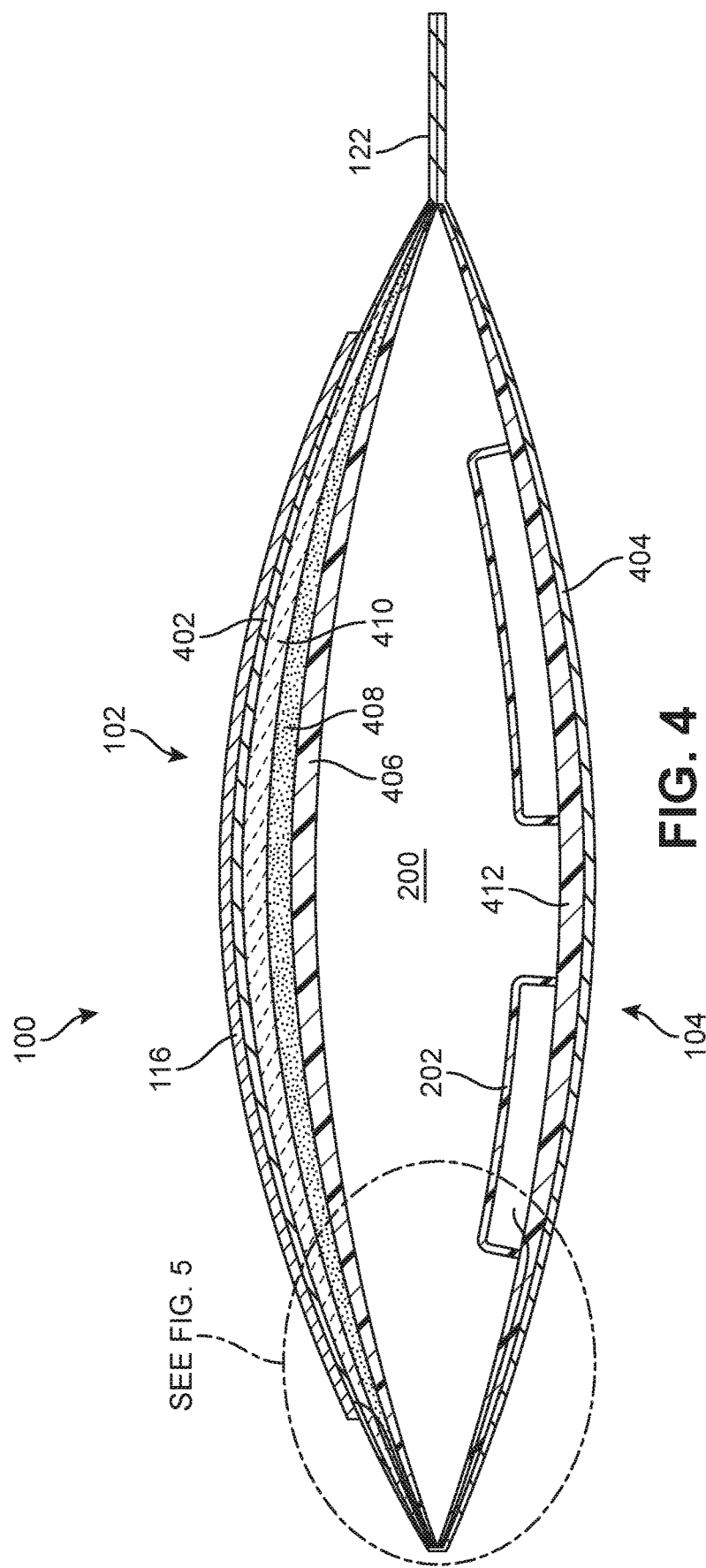
FIG. 4 is a cross-sectional view of an embodiment of a bag.

In some embodiments, the walls of bag 100 may include multiple features. The features can be used alone or in combination. Some embodiments, an exterior wall of bag 100 may include a solar panel 116 comprised of one or more solar cells. In some embodiments, bag 100 may be configured with tab 122 that extends from a location where both side walls are joined. Tab 122 can extend from any edge of bag 100. In the embodiment shown in FIG. 1, tab 122 extends from fourth edge 114. Tab 122 can be made from any suitable material. Preferably, as shown in FIG. 4, tab 122 is made of a flame resistant material, similar to the material discussed later in this description. In other embodiments, tab 122 can be made of a buoyant material. Embodiments of bag 100 can include handle 124. As shown in FIG. 1, handle 124 may be integrally formed as a cut out into tab 122.

In some embodiments, bag 100 may include identification features disposed on the exterior surface. The identification features may allow a user to identify bag 100 if lost. Examples of an identification mark can include; a barcode 118, numerical code or a quick response (QR) code 120. In other embodiments, any other kind of identifier or indicia could be used with bag 100. As shown in FIG. 1, the identification features are disposed on tab 122. Some embodiments of bag 100 can include multiple identification marks.

FIG. 2 is a schematic diagram of an embodiment of an open bag 100, exposing its interior void 200. Bag 100 may contain an interior void 200 with multiple features. Embodiments of bag 100 may include one or more of these interior features. In one embodiment, interior void 200 may include compartmental features such as various pockets for storing different items. In some embodiments, interior void 200 may include one or more pockets. Some embodiments of interior void 200 may include one or more pockets that can be disposed on a wall of bag 100. Referring to FIG. 2, first pocket 202 and second pocket 204 may be disposed on second side wall 104. In other embodiments, first pocket 202 and second pocket 204 may be located on other areas of the walls that create interior void 200.

Figure 3:
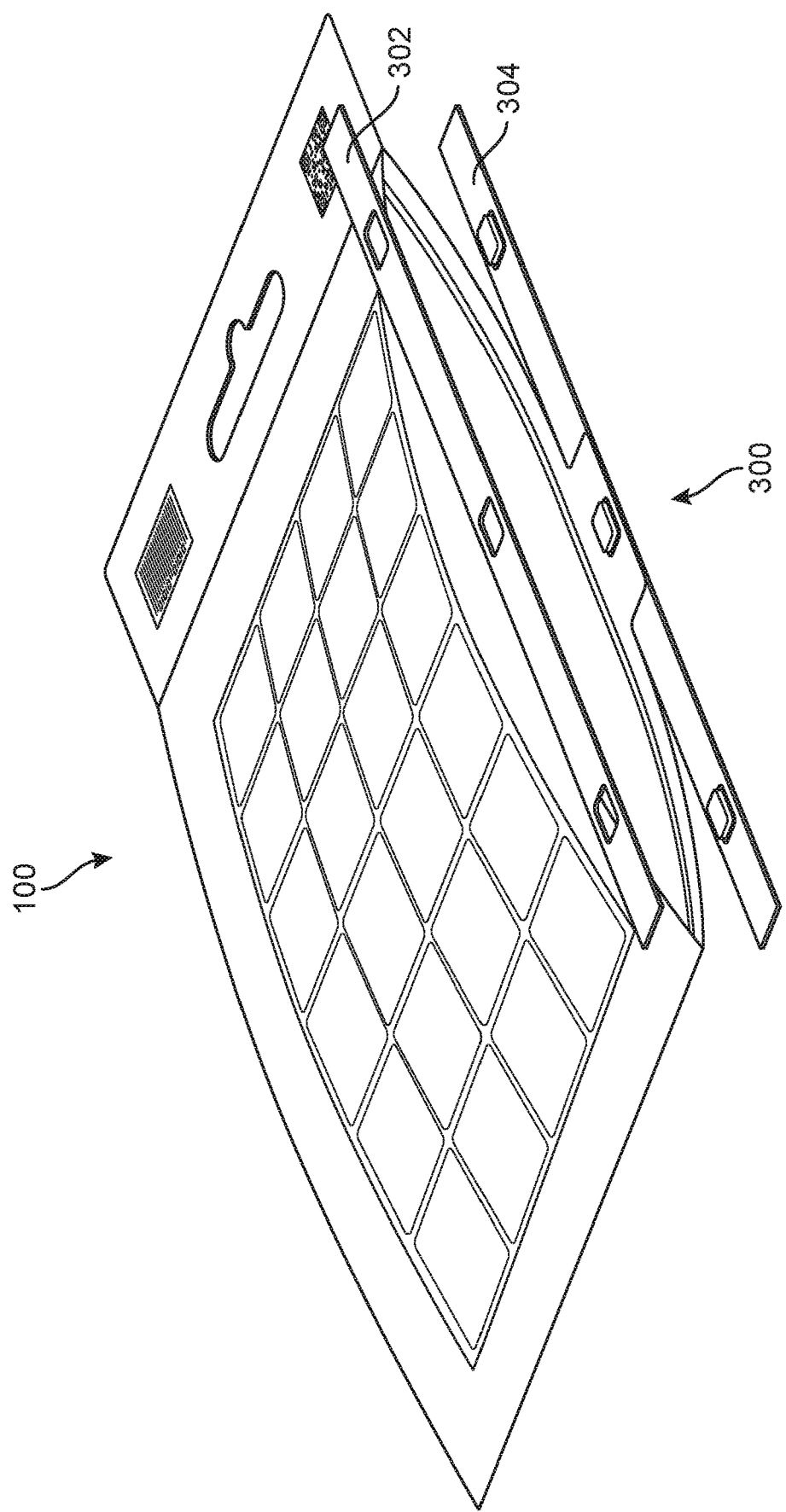
FIG. 3 is a schematic diagram of an exterior view of an embodiment of an open bag.

FIG. 3 is a schematic diagram of an exterior view of an embodiment of open bag 100. In some embodiments, bag 100 may include a seal that can enclose interior void 200 from the external environment. Some embodiments of bag 100 may include a seal with components that provide a releasable closing system that can selectively join first edge 108. Some embodiments can include releasable closure system 300. Releasable closure system 300 can include first closure member 302 associated with first side wall 102, and can also include second closure member 304 associated with second side wall 104. First closure member 302 is configured to join or attach with second closure member 304 thereby creating a seal between first side wall 102 and second side wall 104. In some embodiments, this seal can be a waterproof seal.

Figure 5:
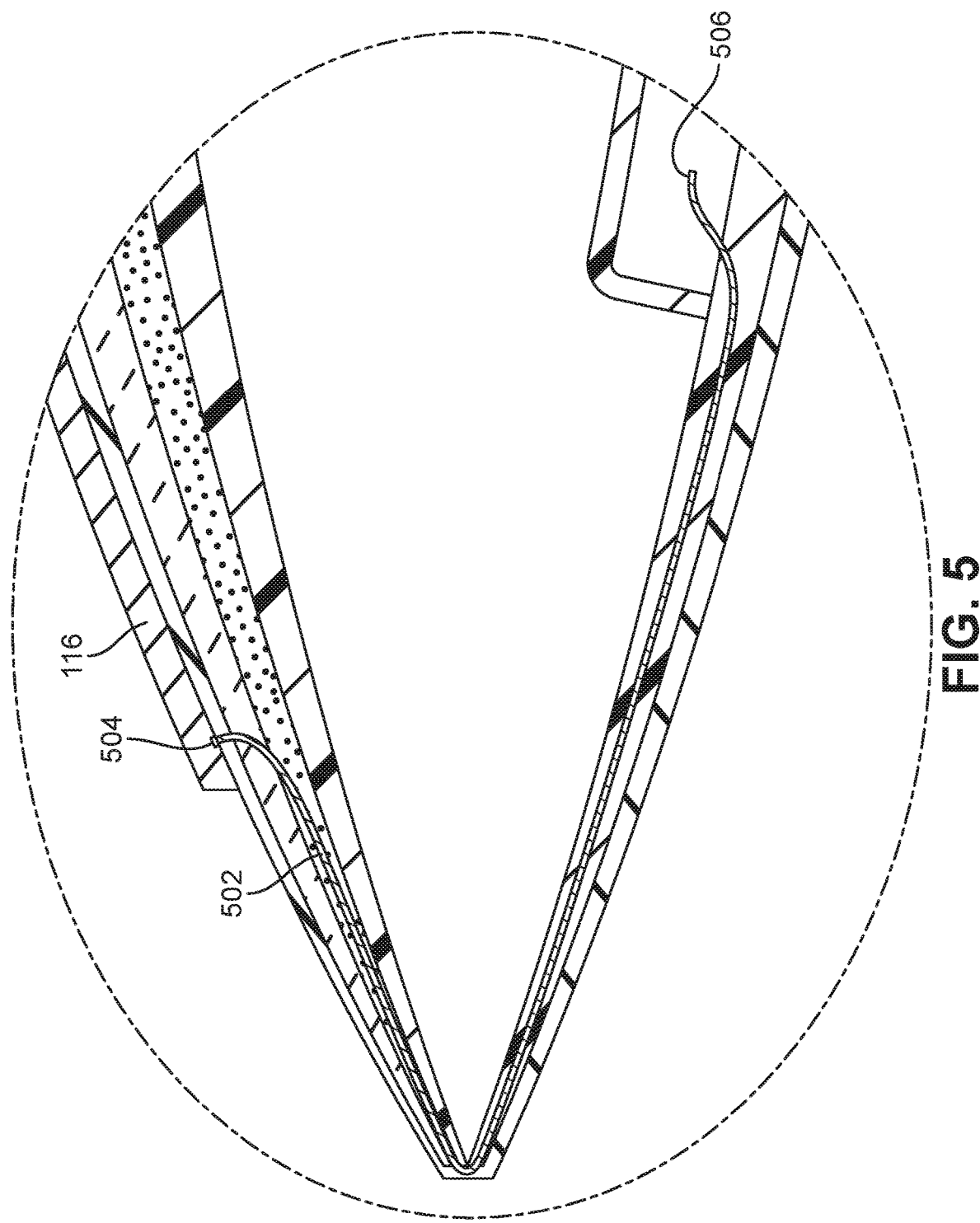
FIG. 5 is an enlarged cross-sectional view of an embodiment of a bag.
Figure 6:
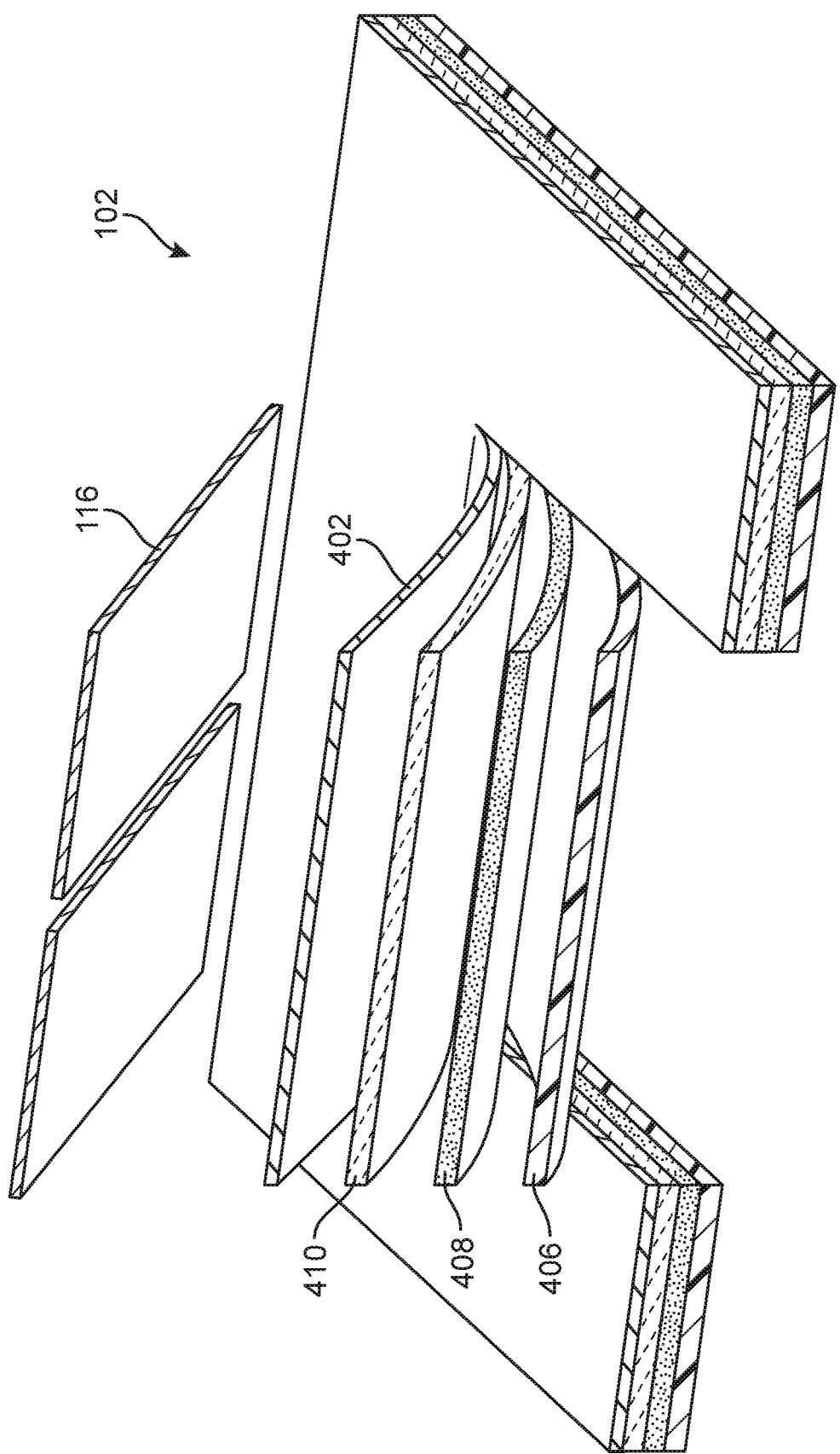
FIG. 6 is an exploded cut away view of an embodiment of a wall of a bag.

Referring to FIGS. 4-6, additional features and structural details of bag 100 can be observed. Some embodiments can include provisions that protect the contents of bag 100 in high temperature or fire conditions. In the embodiment shown in FIGS. 4-6, bag 100 can include a first flame resistant layer 402 and second flame resistant layer 404. In some embodiments, the flame resistant layers are made of a single sheet of material that is folded. In other embodiments, two separate layers are joined to cover bag 100. Preferably, as shown in FIGS. 4-6, the flame resistant layers are the outermost layers of bag 100. In some embodiments, flame resistant layers may also be waterproof.

Some embodiments can include provisions to increase the buoyancy of bag 100. In the embodiment shown in FIGS. 4-6, bag 100 can include a first buoyant layer 406, a second buoyant layer 408, and a third buoyant layer 410. In the embodiment shown in FIGS. 4-6, these three buoyant layers are associated with first side wall 102. Some embodiments can include a fourth buoyant layer 412. In the embodiment shown in FIGS. 4-6, fourth buoyant layer 412 is attached to second side wall 104. Preferably, the buoyant layers are disposed asymmetrically, meaning, one side wall has more buoyant layers than the other side wall. In the embodiment shown in FIGS. 4-6, first side wall 102 is provided with more buoyant layers than second side wall 104. This configuration can help to orient bag 100 in water as detailed below. The various buoyant layers can also help to provide overall buoyancy to bag 100. It may be appreciated that any number of layers, and any ordering of layers could be used in other embodiments.

Some embodiments can include provisions that can provide electrical power to the interior void 200 of bag 100. In some embodiments, an electrical conductor can extend from solar panel 116 to the interior void 200 of bag 100. The electrical conductor can be placed in any desired or suitable location within interior void 200. In some embodiments, electrical conductor 502 is routed through the interior of side wall 102 and in some cases side wall 104. As shown in FIG. 5, which is an enlarged view of bag 100, electrical conductor 502 can extend from a first end 504 to a second end 506. First end 504 of electrical conductor 502 can be attached to solar panel 116. Second end 506 of electrical conductor 502 can extend to any desired location within interior void 200. In the embodiment shown in FIG. 5, second end 506 of electrical conductor 502 extends to first pocket 202. Some embodiments can include provisions to attach various electronic devices to second end 506 to electrical conductor 502. Any suitable mechanical connection may be provided. In some cases, a universal connector, such as a USB connector, may be provided at second end 506 of electrical conductor 502. In the embodiment shown in FIG. 5 where second end 506 of electrical conductor 502 extends into first pocket 202, first pocket 202 can be used to retain or hold an either an electronic device or external battery pack.

Figure 7:
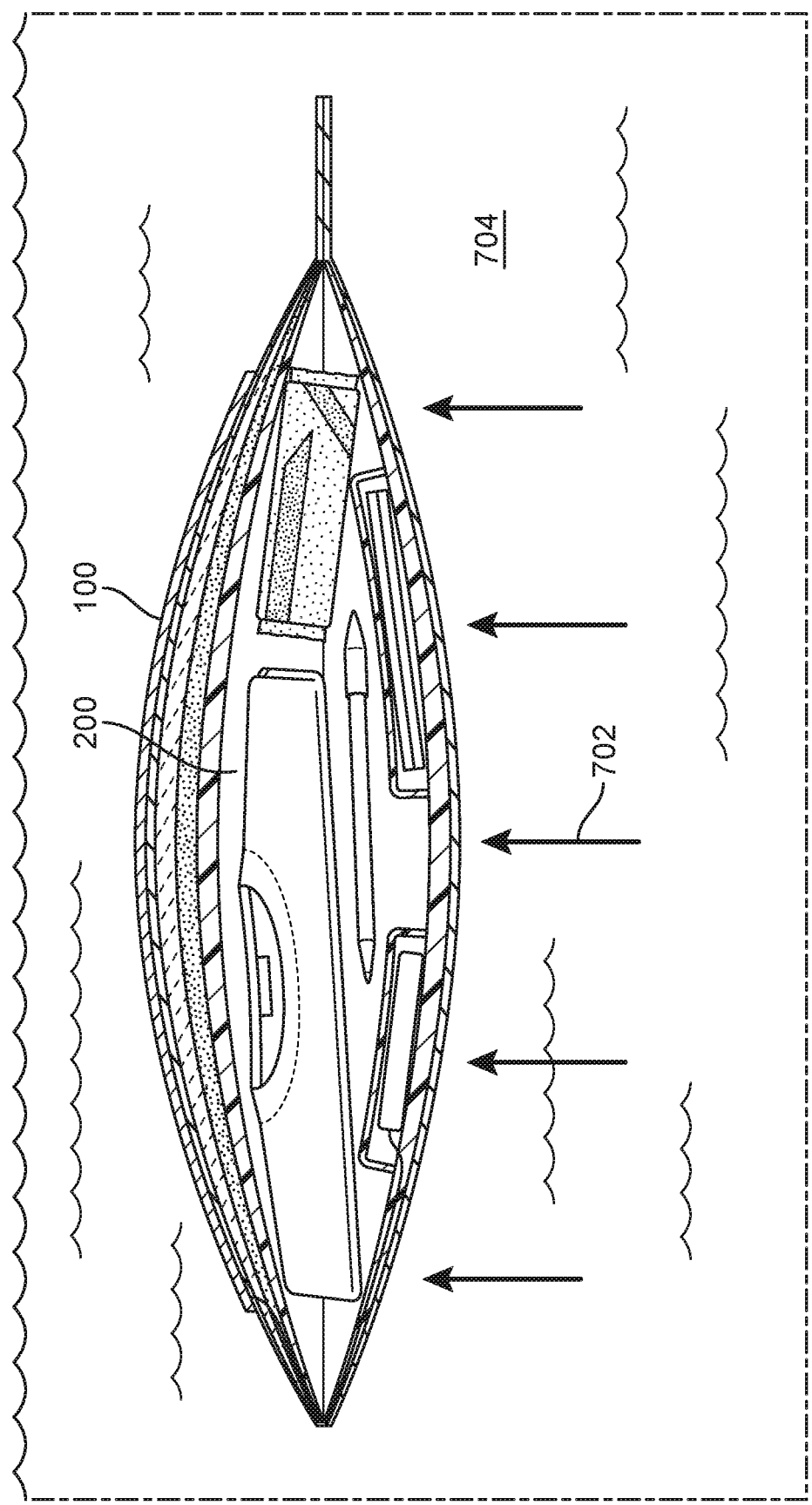
FIG. 7 is a cross-sectional schematic diagram of an embodiment of a bag including contents in water.
Figure 8:
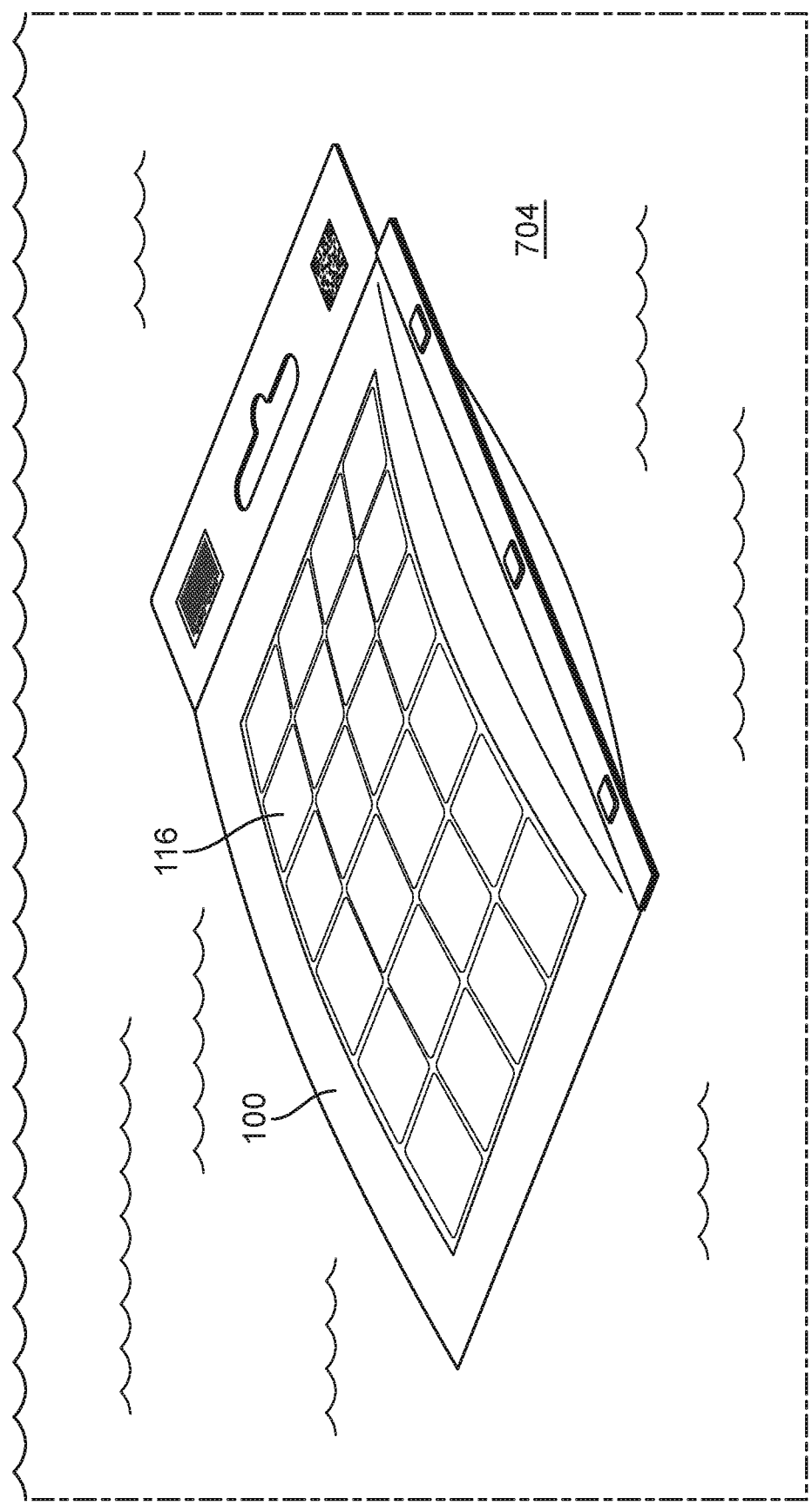
FIG. 8 is a schematic diagram of an embodiment of a closed bag floating in water.

FIG. 7 is a schematic diagram of an embodiment of bag 100 in water. In the embodiment shown in FIG. 7, bag 100 is temporarily submerged. In this embodiment, bag 100 has been filled with various items including an article of apparel, a writing instrument, important documents and an external battery pack. These items occupy interior void 200, and bag 100 has been opened to accommodate these items. As bag 100 is opened to accommodate these items, interior void 200 also increases. When bag 100 is sealed, bag 100 will displace additional water when placed under water. When submerged under water 704, bag 100 will produce buoyant force 702. Buoyant force 702 will eventually cause bag 100 to move from a submerged condition, as shown in FIG. 7, to a floating condition, as shown in FIG. 8. The buoyant layers described above can also assist in contributing a buoyant force to bag 100 when submerged. Referring to FIG. 8, bag 100 is floating on the surface of water 704. In this condition, the solar cells of solar panel 116 are exposed to sunlight and are capable of producing electricity.

Figure 9:
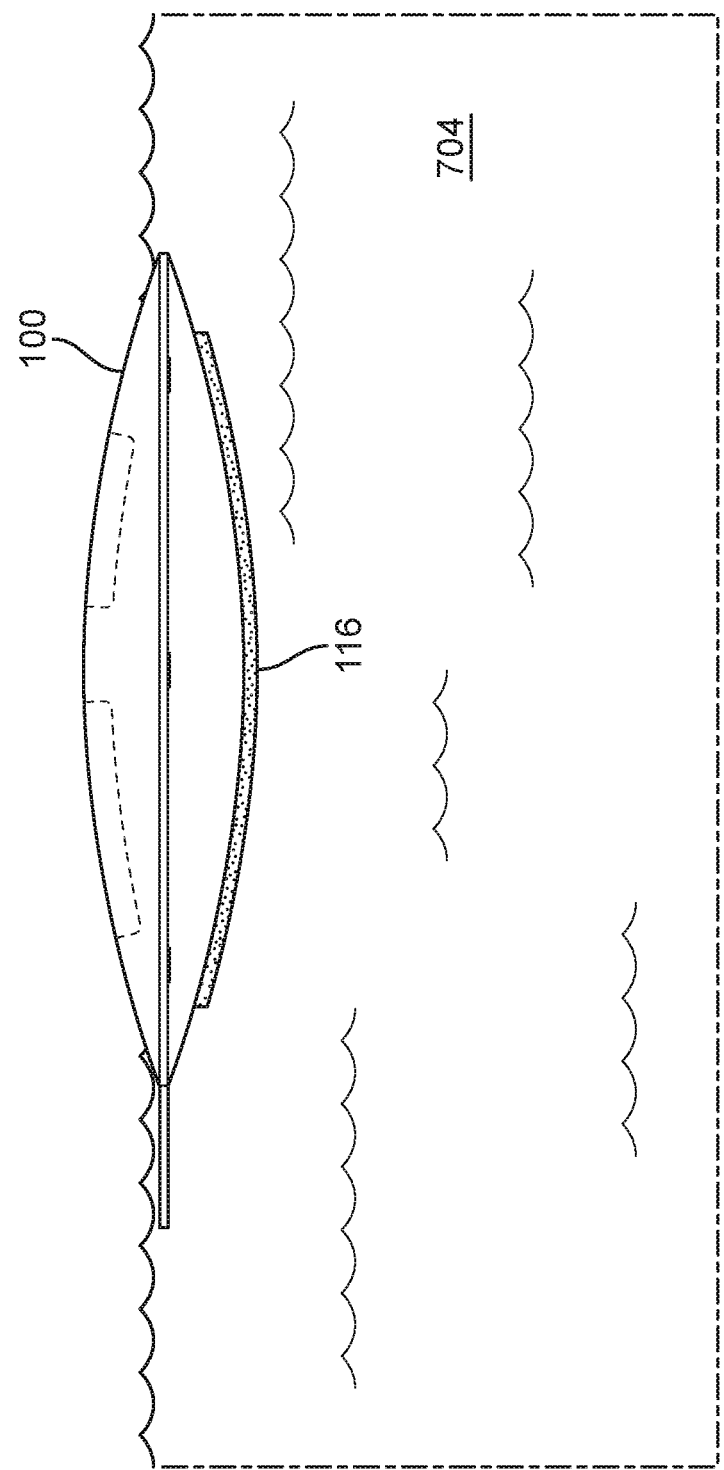
FIG. 9 is a schematic diagram of a side view of an embodiment of a bag floating in water.
Figure 10:
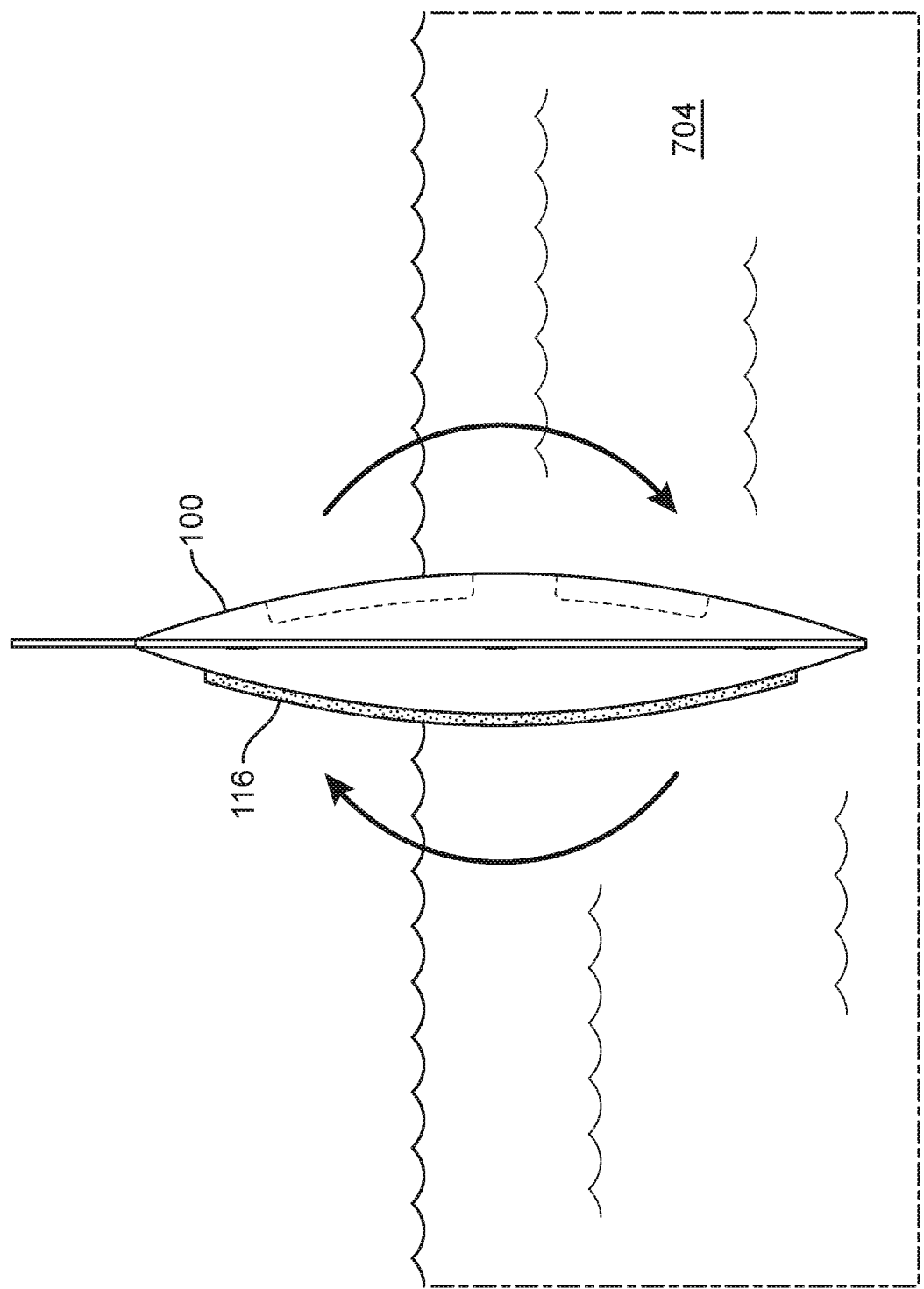
FIG. 10 is a schematic diagram of a side view of an embodiment of a bag adjusting its orientation in water.
Figure 11:
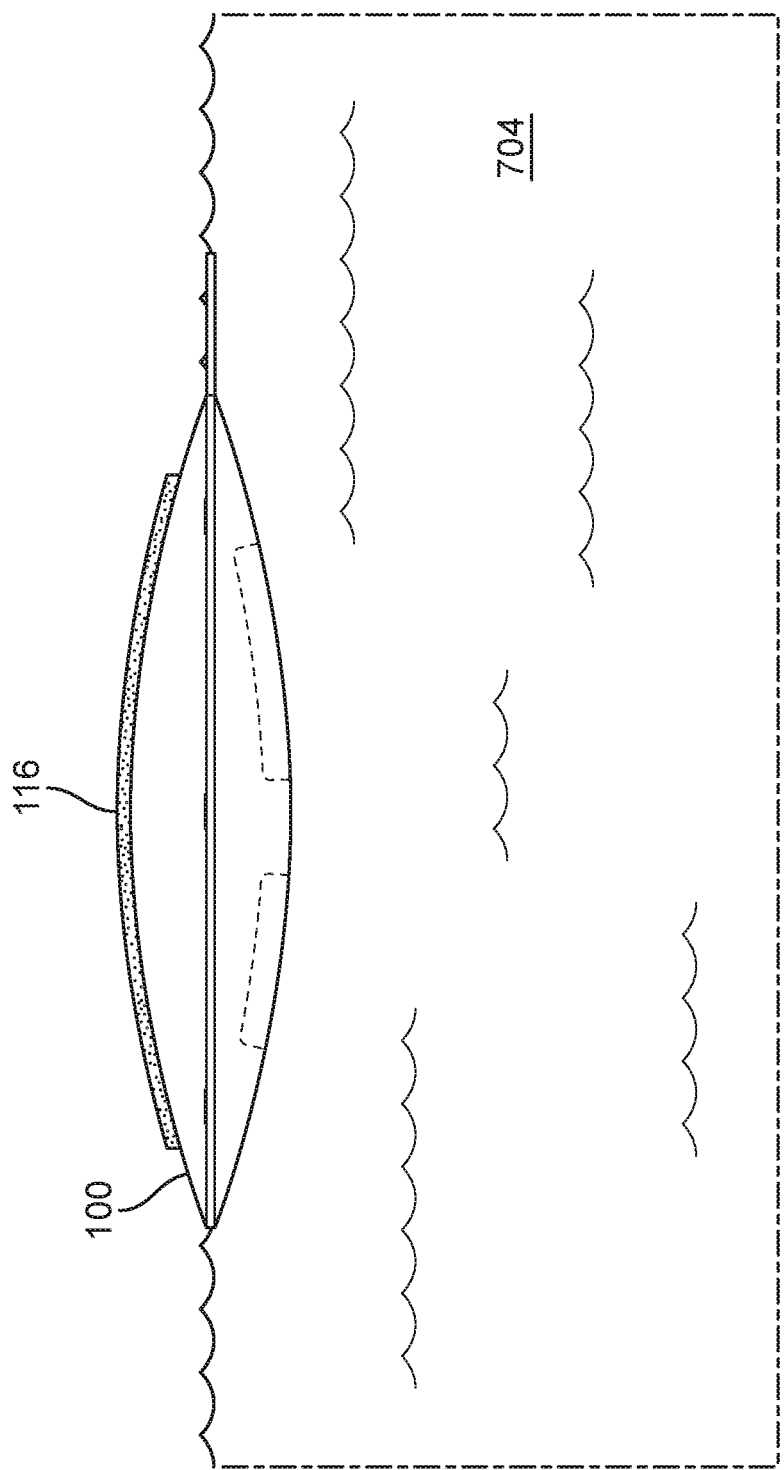
FIG. 11 is a schematic diagram of a side view of an embodiment of a bag floating in water at its correct orientation.

As discussed above, bag 100 preferably includes an asymmetric distribution of buoyant layers, with additional buoyant layers disposed proximate solar panel 116. In some embodiments, heavier items, such as battery packs and other electronics may be placed in pockets that are disposed on the opposite side of bag 100 as solar panel 116. This unequal weight distribution with the heavier items disposed on the opposite side of bag 100 as solar panel 116 also helps bag 100 to self-orient in water. Referring to FIGS. 9-11, an example of this self-orienting feature is shown. In FIG. 9, bag 100 is floating on the surface of water 704. In this position the bag is upside down with submerged and the opposite side of bag 100 being exposed to sunlight. Because of the weight distribution and weight imbalance and because the distribution of the buoyant layers, bag 100 will generally self-orient in water. In the embodiment in FIGS. 9-10, bag 100 will automatically orient in water 704 so that the solar cells of solar panel 116 are exposed to sunlight above the surface of water 704 with the heavier items submerged. FIG. 10 shows an intermediate position of this self-orienting feature where bag 100 is in the process in flipping over from the configuration shown in FIG. 9 to the position shown in FIG. 11. After bag 100 has completed its self-orientation, bag 100 achieves the position shown in FIG. 11. In this position, the solar cells of solar panel 116 are exposed upwards toward the sun and the opposite side of the bag is generally submerged. Bag 100 has now been properly self-oriented so that the solar cells can generate electricity. Bag 100 can achieve this position automatically and without human intervention. The various buoyant layers and weight distribution bias bag 100 into this position shown in FIG. 11 and even if bag 100 is flipped over by waves or other events, bag 100 will generally return to the position shown in FIG. 10 over time automatically and without human intervention because of the self-orienting features provided in different embodiments of bag 100.

Figure 12:
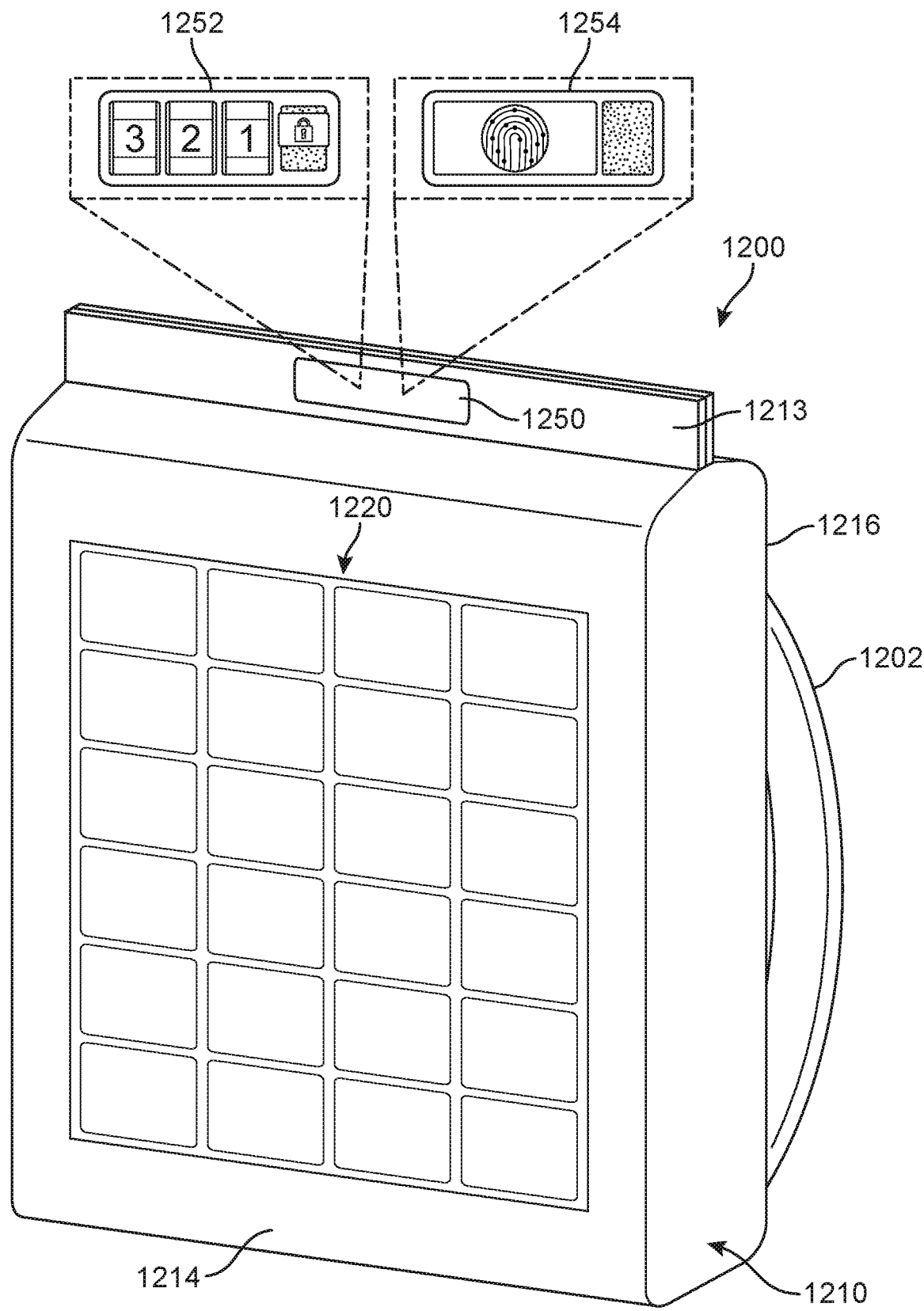
FIG. 12 is a schematic diagram of an isometric view of an embodiment of another embodiment of a bag.
Figure 13:
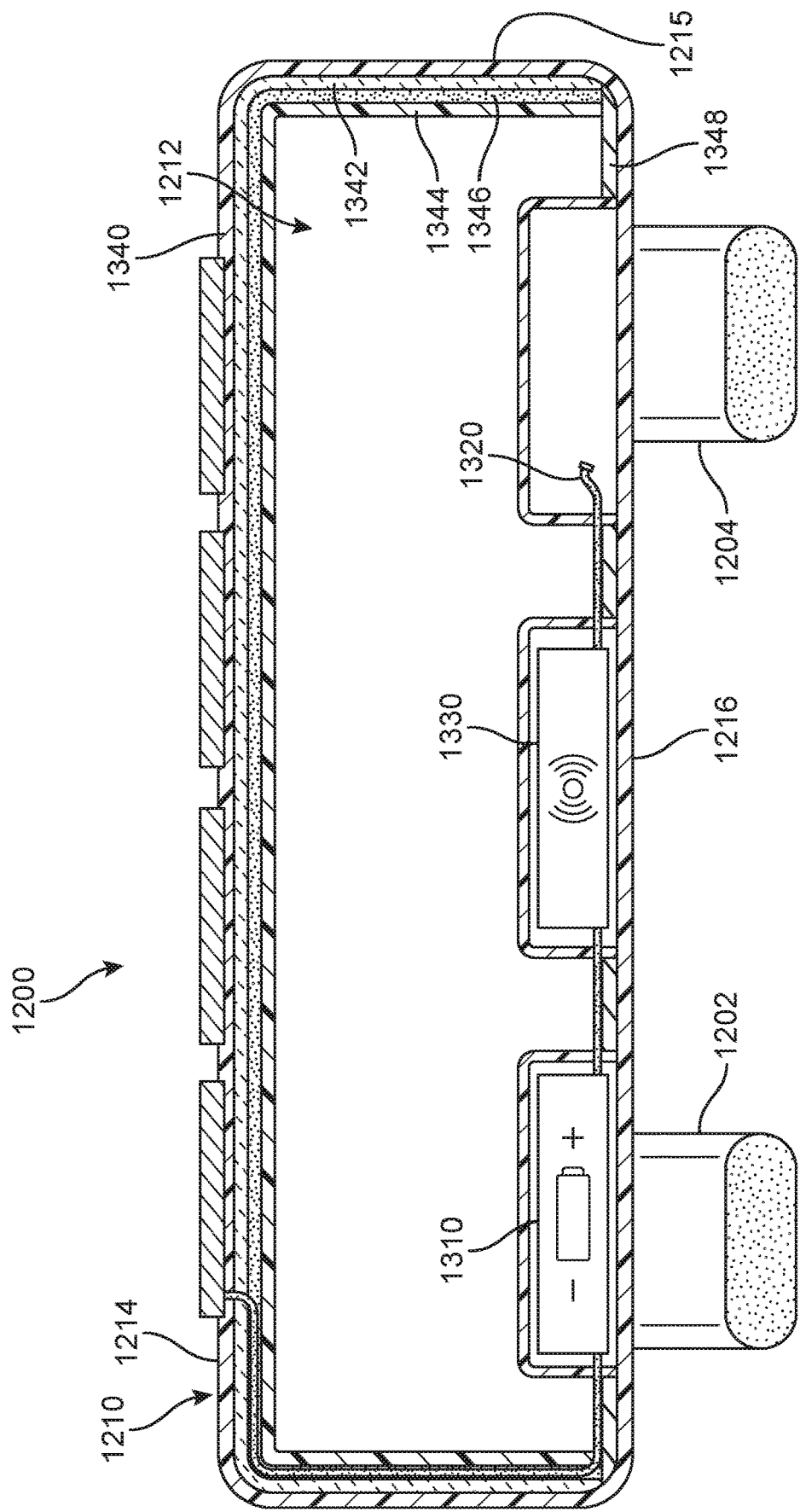
FIG. 13 is a schematic diagram of a cross-sectional view of the bag of FIG. 12.

Embodiments are not limited to the particular size and shape of bag 100. In other embodiments, other types of bags could be used. For example, FIGS. 12-13 illustrate schematic views of another embodiment of a bag 1200. In this case, bag 1200 includes two straps (specifically, first strap 1202 and second strap 1204) so that bag 1200 may be worn as a backpack. In other embodiments, any other kinds of bags could be used, including shoulder bags, handbags, duffle bags as well as other kinds of bags.

The embodiment of FIGS. 12-13 incorporates many of the features described above and shown in FIGS. 1-11, as well as additional features not previously described. It may be appreciated that other embodiments could incorporate any combination of features from two or more embodiments.

As seen in FIG. 12, bag 1200 includes multiple sidewalls 1210 that enclose an interior void 1212 (see FIG. 13). Specifically, bag 1200 comprises five sidewalls, including a distal sidewall, a proximal side wall, two lateral sidewalls and a lower sidewall. Additionally, two or more of the sidewalls meet at a tab 1213, which can be closed to seal bag 1200.

Bag 1200 may include solar panel 1220 comprising multiple solar cells on a distal sidewall 1214. Moreover, solar panel 1220 is disposed on an opposite side of a proximal sidewall 1216 with first strap 1202 and second strap 1204 (see FIG. 13). This ensures that solar panel 1220 is exposed to the sun when bag 1200 is worn on a user's back.

To discourage unauthorized users from gaining access to the contents of bag 1200, a locking mechanism 1250 may be used to secure tab 1213. In different embodiments, different locking mechanisms could be used. For example, in some embodiments, a mechanical locking mechanism could be used, such as a combination locking mechanism 1252. Other mechanical locking mechanisms that could be used include push-button locks and locks with keys. In other embodiments, an electronic locking mechanism could be used. For example, in some embodiments, a biometric locking mechanism could be used, such as a fingerprint reader 1254. Other electronic mechanisms that could be used include other kinds of biometric locking mechanisms and locks incorporating electronic keypads.

The interior of bag 1200, depicted in FIG. 13, can include a main compartment for storing a variety of items. Bag 1200 may also include various pockets for storing permanent or temporary items. For items intended to be permanently stored, such as a battery as described below, the pockets could be partially or fully closed to prevent the items from being removed.

In this exemplary embodiment, sidewalls 1210 may be comprised of multiple layers. The exterior layer 1340 of all sidewalls 1210 may be a fireproof layer. In some cases, exterior layer 1340 may also be waterproof. Although the current embodiment depicts a single exterior layer that extends along each sidewall, in other embodiments, the exterior of the bag could comprise different kinds of materials on different sidewalls. Distal sidewall 1214, as well as the lateral sidewalls 1215, may also be comprised of three buoyant layers: a first buoyant layer 1342, a second buoyant layer 1344 and a third buoyant layer 1346. Proximal sidewall 1216, by contrast, may only comprise a single buoyant layer 1348. This asymmetry in the number of buoyant layers helps ensure bag 1200 will rotate into a position with distal side 1214 facing up, if the bag is floating, in order to keep solar cells pointed towards the sky. This is similar to the asymmetric buoyancy of bag 100, as depicted in FIGS. 8-11. It may be appreciated that the number and order of layers of bag 1200 could vary from one embodiment to another.

Some embodiments may include provisions for tracking a bag. In some embodiments, a bag could be provided with a tracking beacon (or tracking device), such as tracking beacon 1330. Different kinds of tracking beacons could be used, including blue-tooth enabled tracking beacons, WiFi enabled tracking beacons, cellular enabled tracking beacons, GPS enabled tracking beacons or any other kinds of tracking beacons. Generally, the type of tracking beacon used may be selected to optimize the range of tracking and the power needs of the beacon. For example, blue tooth enabled beacons may have low power consumption but may only be detectable in a limited range. Various kinds of GPS enabled tracking systems may facilitate tracking over a longer range but may consume significant power. Although not shown in the Figures, bag 100 could also incorporate a tracking beacon similar to tracking beacon 1300. For example, a tracking beacon could be incorporated into the interior void 200 of bag 100 (see FIG. 2).

Some embodiments may include power to supplement the power generated by a solar panel. In some embodiments, bag 1200 may include an onboard battery 1310. Onboard battery 1310 may be any kind of battery known in the art. For example, onboard battery 1310 could be a rechargeable lithium-ion battery. In embodiments where onboard battery 1310 is rechargeable, power for recharging it could be supplied by solar panel 1220. In other embodiments, a non-rechargeable battery could be used. Onboard battery 1310 may be used to power a variety of different items, including a user's cell phone or other device via charging port 1320. Onboard battery 1310 could also be used to provide power to tracking beacon 1330. If an electronic locking system is used, such as a fingerprint reader, battery 1310 could also be used to power the locking system.

It may therefore be appreciated that the embodiments provide a bag for securing/protecting items in a disaster. The bag can provide water and fire protection (via one or more fireproof and/or waterproof layers), security (via a locking mechanism), easy identification (via QR codes, for example), charging capabilities (via solar panels and/or onboard batteries), and tracking capabilities (via a tracking beacon). Some embodiments may incorporate each of these features, while others could incorporate selective features.

While various embodiments of the invention have been described, the description is intended to be exemplary, rather than limiting, and it will be apparent to those of ordinary skill in the art that many more embodiments and implementations are possible that are within the scope of the invention. Accordingly, the invention is not to be restricted except in light of the attached claims and their equivalents. Also, various modifications and changes may be made within the scope of the attached claims.

We claim:

1. A bag comprising:
   a first side wall and a second side wall joined along a perimeter to define an interior void of the bag;
   the first side wall including a solar panel disposed on an outer surface of the first side wall, the first side wall also including at least two buoyant layers;
   the second side wall including at least one pocket disposed on the second side wall inside the interior void, the second side wall also including a buoyant layer;
   wherein the at least one pocket on the second side wall is disposed opposite from the at least two buoyant layers of the first side wall;
   wherein the first side wall has more buoyant layers than the second side wall to automatically self-orient the bag in water so that the solar panel is disposed closer to a surface of the water than the second side wall and so that the at least one pocket is disposed beneath the solar panel.

2. The bag according to claim 1, wherein the first side wall is permanently joined to the second side wall around a portion of the perimeter, thereby forming the interior void disposed between the first side wall and the second side wall.

3. The bag according to claim 1, wherein the perimeter also includes a releasable closing system.

4. The bag according to claim 3, wherein the releasable closing system is capable of selectively joining the first side wall to the second sidewall proximate the releasable closing system.

5. The bag according to claim 3, wherein the releasable closing system produces a waterproof seal when closed.

6. The bag according to claim 1, wherein the second side wall includes a battery compartment formed on an interior surface of the second side wall; and wherein an electrical conductor extends between the solar panel and the battery compartment.

7. The bag according to claim 6, wherein the electrical conductor is disposed within the first side wall.

8. The bag according to claim 6, wherein the electrical conductor is disposed within the second side wall.

9. The bag according to claim 6, wherein the electrical conductor includes an electrical connector proximate the battery compartment.

10. The bag according to claim 1, wherein the first side wall and the second side wall include a flame resistant layer.

11. The bag according to claim 1, further comprising an integrated handle formed on the remaining perimeter.

12. The bag according to claim 1, further comprising an identification mark disposed on an outer surface of the bag.

13. The bag according to claim 1, wherein the at least one pocket comprises a first pocket and a second pocket.

14. The bag according to claim 1, further comprising at least two straps configured to allow the bag to be worn as a backpack.

15. The bag according to claim 1, wherein the at least two buoyant layers of the first side wall include a first buoyant layer, a second buoyant layer, and a third buoyant layer; and
   wherein the buoyant layer of the second side wall includes a fourth buoyant layer.

16. The bag according to claim 1, wherein one or more objects placed in the at least one pocket are configured to assist with automatically self-orienting the bag so that the solar panel is disposed closer to the surface of the water than the second side wall.

* * * * *